BACKWARD WAVE PARAMETRIC AMPLIFIER WITH FIXED IDLER FREQUENCY AND PHASE PROPAGATION CONSTANT

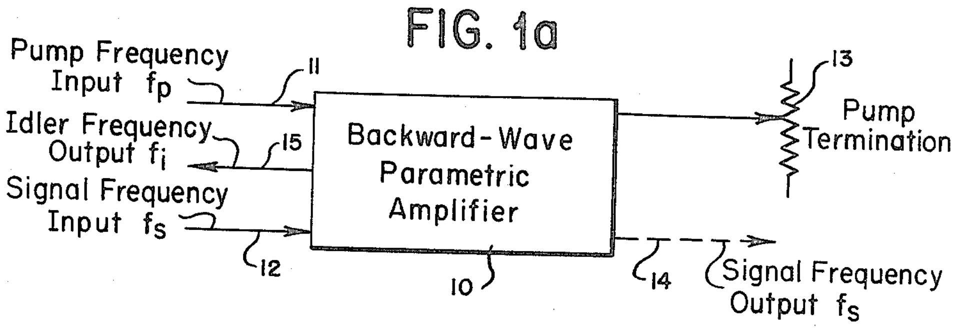
FIG. 1a
FIG. 1b
| Group Velocity $V_g$ | Phase Velocity $V_f$ | Frequency |
|---|---|---|
| → | → | Signal |
| ← | ← | Idler |
| → | → | Pump |
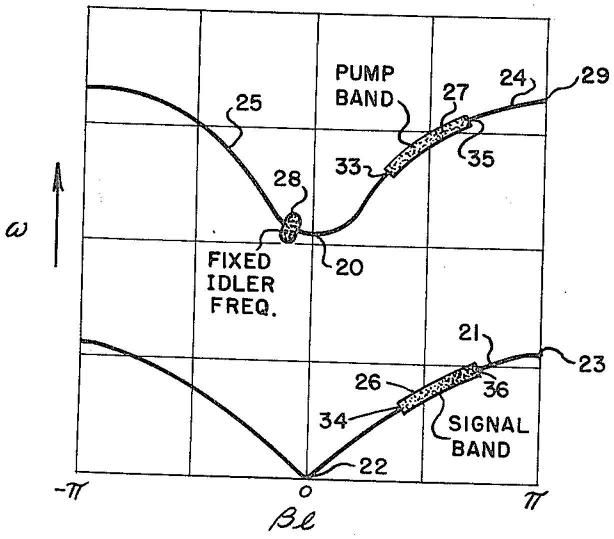
FIG. 2
INVENTOR
Seymour Okwit
BY
Pennie Edmonds Morton Barrows & Taylor
ATTORNEYS INVENTOR
Seymour Okwit
BY
Brumbaugh, Free, Graves & Donohue
ATTORNEYS Feb. 9, 1965 S. OKWIT 3,169,225

Filed Aug. 10, 1962 3 Sheets-Sheet 3

INVENTOR
Seymour Okwit
BY
ATTORNEYS

3,169,225
BACKWARD WAVE PARAMETRIC AMPLIFIER WITH FIXED IDLER FREQUENCY AND PHASE PROPAGATION CONSTANT

Seymour Okwit, Plainview, N.Y., assignor to Cutler-Hammer, Inc., Milwaukee, Wis., a corporation of Delaware Filed Aug. 10, 1962, Ser. No. 216,196
6 Claims. (Cl. 330—4.6)

This invention relates to backward-wave parametric amplifiers.

Parametric amplifiers are well known, and have been found useful because of their low noise properties. In general, such amplifiers have at least one variable reactance component whose reactance is varied at a pump frequency higher than the signal frequency, and amplification of a signal is obtained by applying it to the variable reactance. Commonly, variable capacitance semiconductor diodes are employed to provide the variable reactance, although variable inductance components can be used. For example the latter may consist of a ferrite material.

In the functioning of a parametric amplifier, a frequency equal to the difference between the pump and signal frequencies is developed. This is often called the "idler" frequency. By employing a sufficiently high pump frequency, the idler frequency can be made substantially higher than the signal frequency, and in general this gives better noise performance as well as other advantages.

It is frequently desired to have a narrow passband receiver that is capable of being tuned across a wide input frequency band, and has a low noise figure. Backward-wave parametric amplifiers (BWPA) have been suggested for such purposes, but usually the center frequency of the output pass band varies as the amplifier is tned. When used in a receiver of the superheterodyne type, this requires a complex demondlator or mixer following the amplifier to convert the variable amplifier output frequency to a fixed intermediate frequency. When used for other purposes, the variable output frequency may be disadvantageous due to the requirement for wideband circuits, etc.

In U.S. application Serial No. 131,400 filed August 14, 1961, by Okwit and Grace for "Parametric Amplifiers," a backward-wave parametric amplifier is described in which the center frequency of the output passband remains relatively constant as the amplifier is tuned over the input signal band. The amplifier includes a pair of transmission lines, coupled by distributed variable reactance. Signal and pump frequencies are applied in respective frequency bands to respective transmission lines to produce an idler frequency. The transmission lines have frequency-phase propagation characteristics predetermined to produce variations in the respective phase propagation constant which change in compensating directions in the respective signal and pump frequency bands to yield a substantially fixed idler phase propagation constant at an approximately fixed idler frequency.

In the specific embodiments described in that application, one transmission line is a backward-wave line and the pump frequency propagates therein. The other transmission line is a forward-wave line and the signal and idler frequencies propagate therein in opposite directions. A directional coupler or filter is used to apply the signal to the forward-wave line and extract the idler frequency therefrom. For some applications it is difficult to design a backward-wave line having optimum characteristics for use in this type of amplifier, particularly at higher frequencies extending into the microwave region.

The present invention provides a backward-wave parametric amplifier using a pair of forward-wave transmission lines which, like the above-mentioned amplifier, is capable of being tuned over a wide input signal band while yielding a relatively constant frequency output signal. The use of only forward-wave lines greatly facilitates the design of lines having properly shaped characteristics for many applications.

In accordance with the invention, the signal frequency is applied to one line, and this may be of the low-pass type. The other line carries both pump and idler frequencies, but they propagate in opposite directions. This line is of the band-pass type and is designed so that the idler frequency is located near the low frequency cutoff region where the idler phase propagation constant is relatively small and the group velocity is considerably different from the region where the pump frequency propagates. The characteristic of the low-pass line is shaped with respect to that of the bandpass line so that the group velocities of pump and signal frequencies are approximately equal, and the frequency-phase characteristics yield a substantially fixed idler phase propagation constant at an approximately fixed idler frequency in the low frequency cutoff region of the bandpass line.

Certain additional advantages are present in this type of BWPA. Inasmuch as pump and idler frequencies propagate on the same line, rather than signal and idler frequencies, it is possible to use higher idler frequencies and hence further improve the noise figure of the amplifier. Also, it is unnecessary to use a directional coupler or filter in the signal input line to separate signal and idler frequencies, hence dissipative losses therein which would degrade the input signal may be avoided. Also, as will be explained, diode biasing is simplified.

On the other hand, with a high ratio of pump power to idler power it may be necessary to employ sharp filters at the band pass line to prevent pump frequencies from interfering with the operation of circuits receiving the idler output. Consequently, the relative merits of the two types of amplifiers may be taken into account for a given application.

As set forth in the above-identified application, in general, in order to obtain amplification in a backward-wave parametric amplifier, the following conditions must be met:

$$f_p = f_s + f_i \quad (1)$$

$$\beta_p = \beta_s + \beta_i \quad (2)$$

$$(V_g)_i \times (V_g)_s < 0 \quad (3)$$

In these equations the subscripts $p$, $s$ and $i$ refer to pump, signal, and idler, respectively. Frequency is denoted $f$ and $\beta$ is the phase-propagation constant for the respective frequency. The phase-propagation constant can be either positive or negative, and commonly $\beta$ refers to phase shift per unit length in a transmission line. The quantity $V_g$ is the group velocity of the frequency component denoted by the subscript.

The two conditions set forth in the Equations 1 and 2 are the same as the conditions required for amplification in a traveling-wave reactance amplifier. The third condition requires that the group velocities of the signal and idler be in opposite directions, so that one is negative with respect to the other, thereby making the product less than zero.

The invention will be more fully understood by reference to the following description of a specific embodiment thereof, wherein additional features and advantages thereof will in part be pointed out and in part be obvious to those skilled in the art.

In the drawings:

FIGS. 1(*a*) and 1(*b*) illustrate a set of propagation characteristics used in the amplifier of the invention;

FIG. 2 is an $\omega$–$\beta$ diagram illustrating operation in accordance with the invention;

Figure 3:
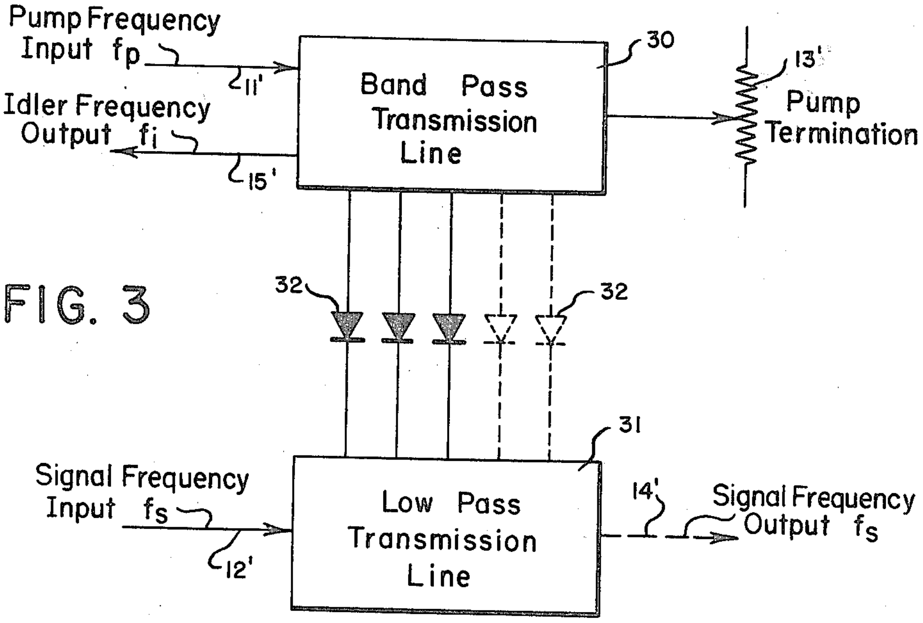
FIG. 3 shows a block diagram of an amplifier in accordance with the invention.

Referring to FIG. 1(*a*), numeral 10 designates a backward-wave parametric amplifier in accordance with this invention. Pump and signal frequency inputs are applied through lines 11 and 12, respectively. At the opposite end of the amplifier, a pump termination 13 is provided to prevent reflections of pump frequency waves. An amplifier output at the signal frequency is available as indicated by dotted line 14, but is not normally used. The amplified output normally used is at the idler frequency, and is supplied to subsequent circuits through line 15.

FIG. 1(*b*) shows the combination of group and phase velocities utilized in the amplifier of the invention. The directions of the group velocity $V_g$ and phase velocity $V_f$ are given for signal, idler, and pump frequencies. (To avoid confusion the subscript "*f*" is used for phase, since "*p*" is used for pump.)

It will be noted that the group and phase velocities of each of the frequencies are in the same direction, thus indicating forward-wave propagation for all three. However, velocities for the idler frequency are opposite to those for the other frequencies, indicating propagation in the reverse direction. Since the group velocity of the idler frequency is in the opposite direction to the group velocity of the signal frequency, Equation 3 is satisfied and backward-wave operation is obtained.

FIG. 2 shows an $\omega$–$\beta$ diagram illustrating the design and operation of the transmission lines used in accordance with this invention. Diagrams of this type are used increasingly in the art since a great deal of information can be obtained therefrom. Since $\omega$ equals $2\pi f$, it is commonly referred to as angular frequency or simply "frequency." The ratio of $\omega$ to $\beta$ at any point on the curve gives the phase velocity $V_f$. The slope of the curve at any point gives the group velocity $V_g$. If both $V_g$ and $V_f$ are of the same sign, forward-wave propagation occurs. If they are of opposite sign (not true of the curves here shown), backward-wave propagation exists. A zero slope such as at point 20 indicates no propagation, hence indicating cutoff.

The horizontal coordinate, which is denoted $\beta l$, represents the phase shift per section of an artificial transmission line or an equivalent unit length of a distributed transmission line.

Curve 21 is a characteristic of a low-pass transmission line or filter section. At zero frequency there is zero phase shifts as shown at point 22. The curve rises relatively linearly with frequency over a certain range, and then the slope decreases until it becomes zero at 23, indicating cutoff. Below cutoff both the slope and the $\omega/\beta$ ratio are positive, indicating forward-wave propagation.

Curve 24 is a characteristic of a bandpass transmission line designed as a forward-wave structure. Between the end points 20 and 29, the slope and $\omega/\beta$ are positive, indicating forward-wave propagation.

Curve 25 is also that of a bandpass filter and has the same shape as 24 but is reversed from right to left. The slope and $\omega/\beta$ are both negative, indicating forward-wave propagation. As is explained below, curves 24 and 25 are for the same bandpass transmission line, but represent wave propagation in opposite directions.

In drawing curves such as shown in FIG. 2 certain conventions must be established as to direction of velocity and direction of phase shift. Initially, these may be arbitrarily established, but once established, they should be consistently followed. The curves of FIG. 2 are drawn to agree with 1(*b*) wherein the arrows indicate positive velocity directions, and reference velocity and phase are with respect to the left hand end of block 10 in FIG. 1(*a*).

An input signal band 26 is shown on curve 21. It will be noted that as the signal frequency increases, the phase shift also increases. Both group and phase velocities are positive. Hence, this corresponds to an input signal in line 12 of FIG. 1(*a*), and the velocities are as shown in FIG. 1(*b*).

Curve 24 corresponds to a bandpass transmission line to which the pump frequency is supplied. The pump tuning range is indicated at 27. It will be observed that the group velocity (slope) is positive, agreeing with a pump input at line 11 of FIG. 1(*a*) and the group velocity arrow for the pump in FIG. 1(*b*). The tuning range 27 lies in a region in which the phase velocity is positive (since $\beta l$ is positive) corresponding to the direction of the phase velocity arrow in FIG. 1(*b*).

The idler frequency is shown as a narrow frequency band 28 rather than a point, to indicate that there is an appreciable although narrow bandwidth at the idler frequency. Band 28 is shown to be near the low frequency cutoff region of the bandpass transmission line, where the idler frequency phase-propagation constant $\beta_i$ is relatively small. Advantageously the group velocity, or slope of the curve at this region, is relatively small.

As shown in FIG. 1(*b*) the idler phase velocity and group velocity are to the left and opposite to the phase and group velocities of the pump and signal. Accordingly, curve 25 represents this condition since both the group and phase velocities are negative.

In FIG. 3, a bandpass, forward-wave transmission line is indicated at 30. The pump frequency input is applied on line 11', corresponding to 11 in FIG. 1(*a*). The other end of line 30 is provided with a pump termination 13'.

A low-pass transmission line 31 is coupled to line 30 by a number of variable capacitance diodes 32 distributed along the lengths thereof. The number of diodes may vary with the particular application and hence some are shown dotted.

The signal frequency input is supplied through line 12', and the signal frequency output is available at line 14'. Usually this signal output is not used, and the line 14' is terminated by a matching resistance.

The idler frequency output from line 30 is available at 15'.

The two transmission lines are designed so that the slopes of the respective frequency-phase characteristics are substantially the same for the signal and pump frequency bands, and so that the difference between the pump and signal frequencies throughout the respective bands yields a substantially constant idler frequency having a phase-propagation constant substantially equal to the difference of the pump and signal propagation constants throughout the tuning range, as is explained below with reference to FIG. 2.

In FIG. 2, the portions of the curves 21 and 24 lying within the signal band 26 and the pump band 27 have substantially equal slopes at corresponding points in the two bands. Accordingly, the difference between the lowest pump frequency 33 and the lowest signal frequency 34 will be substantially equal to the difference between the highest pump frequency 35 and the highest signal frequency 36, these differences corresponding to the substantially fixed idler frequency as indicated at 28.

Equations 1 and 2 set forth necessary relationships between frequency and phase for parametric amplification. Thus, if amplification is to be obtained with a substantially fixed idler frequency, the difference between the pump and signal phase constants must remain substantially constant. This will be an algebraic difference since the phase propagation constants in Equation 2 include sign as well as magnitude. This condition is met in FIG. 2 where it will be observed that as the pump and signal frequencies increase, the signal phase constant increases by an amount equal to the increase in the pump phase constant, thereby compensating for the change. For example, subtracting the phase of point 34 from that of point 33 yields a small phase difference which is substantially the same as that obtained by subtracting the phase of 36 from that of 35. As will be observed, corresponding phases of the pump band 27 are slightly less than those of signal band 26, so that the difference is a small negative phase. Thus the difference phase lies in idler region 28. With a relatively small slope of curve 25 in region 28, small differences in the slopes of the pump and signal regions 27, 26 which change the idler phase over the tuning range will result in only small changes in the idler frequency.

These conditions can be met in practice by proper design of the bandpass and low-pass transmission lines. The manner in which a transmission line may be designed for a particular frequency-phase characteristic within a given frequency band is known in the art. In the present instances, the design of one line is correlated with the design of the other to fulfill the conditions of Equations 1 and 2 over the desired tuning range.

Briefly, the design may start with a pair of equations representing the phase characteristics of the lines as a function of the frequency applied thereto, cutoff frequencies and a filter constant in the case of a bandpass filter. Such equations are well known in the art. The equations may then be normalized as to their frequency terms and put in similar form for pump, signal and idler frequencies. Then, by using Equation 2, a general solution can be obtained for the filter constant. The desired tuning range may be introduced using normalized expressions for the average pump and signal frequencies corresponding to the respective bandwidths, and substituting them in the general solution for the filter constant to obtain a solution satisfying the tuning conditions at midband.

The condition for equal slopes can be obtained by differentiating the respective phase equations, equating them, and solving for the filter constant in general terms. The tuning range requirement may then be introduced to obtain a solution for the filter constant satisfying the slope conditions at the respective midbands of the pump and signal tuning ranges.

The resultant two equations for filter constants satisfying midband phase and slope conditions may then be solved simultaneously to obtain a filter constant satisfying both requirements.

It is desirable for the frequency-phase characteristics to be as linear as possible in the pump and signal bands, in order to yield as constant an idler frequency as possible meeting the phase requirement. However, linearity is not essential so long as the slopes at corresponding points in the signal and pump bands are substantially the same.

FIGS. 4–7 show a particular microwave transmission line structure which will operate as a parametric amplifier in accordance with this invention. The structure is a combination of a reduced height waveguide periodically loaded with pairs of variable reactance diodes connected in series, forming a bandpass transmission line, and inductive transmission line sections located between the top and bottom waveguide planes and connected between the diode pairs to form a series-inductance, shunt-capacitance low-pass transmission line. Since the diodes form part of both lines, they provide coupling therebetween.

In the bandpass transmission line, the conductive walls of the waveguide are formed by a top wall 41, sidewalls 48, 48′, and bottom wall 49. These are joined together, as by bolting, but the details are omitted for simplicity of illustration. Spaced periodically along the waveguide are pairs of variable reactance diodes 43 which are centered in the waveguide with a terminal of one diode of each pair connected to top wall 41 and a terminal of the other connected to bottom wall 49. The adjacent terminals are connected together and are effectively in series with respect to their response in the bandpass line. The diodes are supported by a strip 47 of low-loss material and other means to be described below.

Pump frequency power is supplied to the amplifier through coaxial connector 42. Suitable means are provided for coupling energy from the connector to the waveguide. As here shown, the inner conductor of the connector extends into the waveguide and terminates in a cone 40 for broad-banding purposes. The idler frequency output is also obtained from connector 42. A circulator or frequency selective filter may be utilized to separate the two signals.

In an ordinary waveguide the low frequency cutoff is determined primarily by the cross-sectional dimensions of the waveguide. This is also true in the structure shown, but the capacitance of the diodes affects the low-frequency cutoff, and in general a somewhat lower cutoff is obtained. The diode capacitance and the spacing thereof are primary factors in determining the high-frequency cutoff point. These parameters may be correlated to give the desired bandpass characteristic, as will be understood by those skilled in the art. The structure is analogous to a periodically ridged waveguide, the design of which is known in the art.

As will be explained more fully hereinafter, the diodes in a pair are poled in opposite directions. Accordingly, as the capacitance of one increases, that of the other decreases. Thus the capacitance periodically shunted across the waveguide is relatively constant.

The waveguide is terminated in a pump load consisting of a tapered slab 44 of lossy material supporting periodically spaced capacitors 45 which have capacitance values approximately equal to the average capacitance of the pairs of diodes 43 and serve as dummy diodes to avoid discontinuities. Thus capacitors 45 maintain the propagation characteristics and field configuration of the loaded waveguide in such manner as to prevent reflections.

Figures 4, 5, 6, 8:
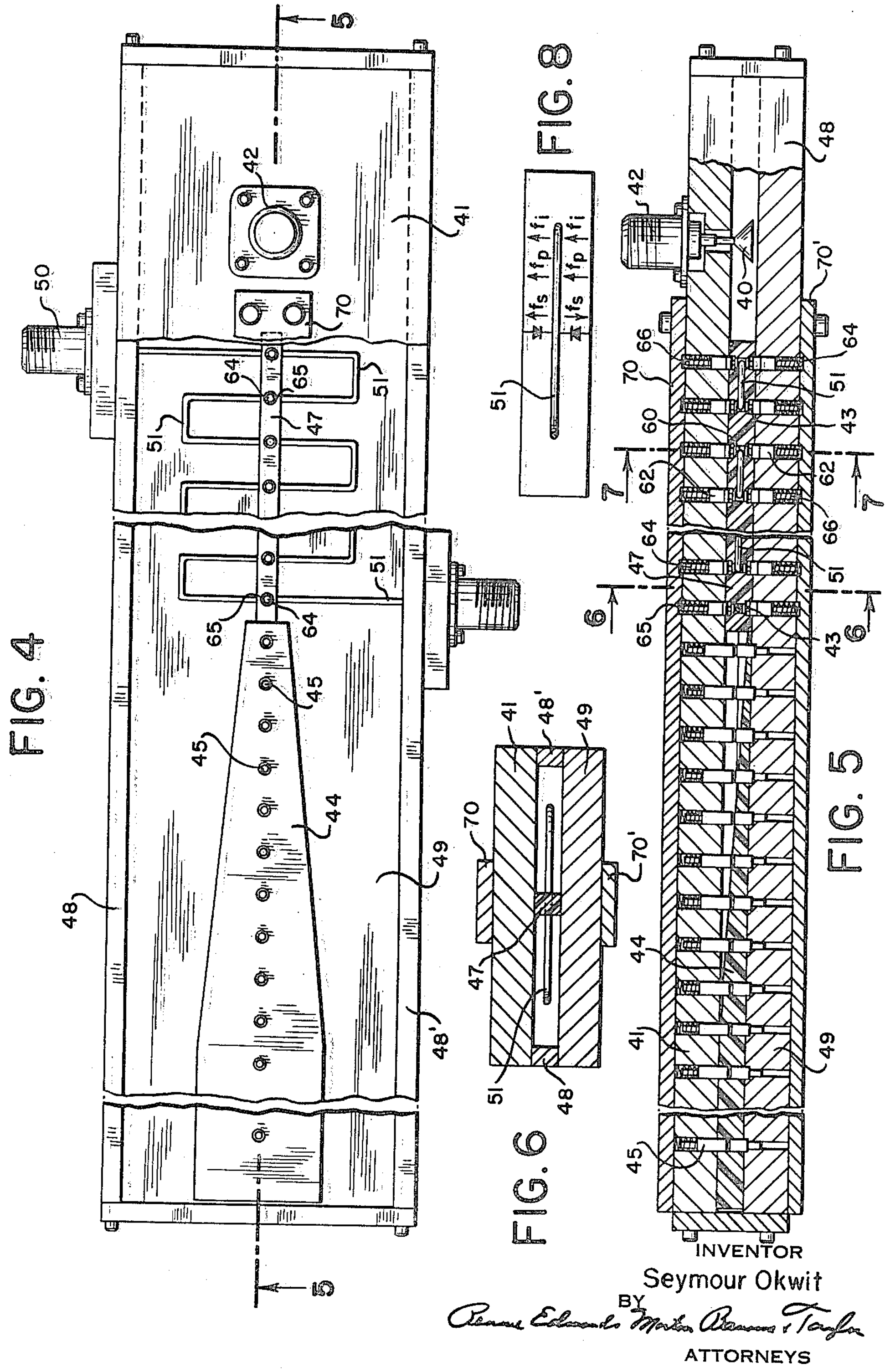
FIG. 4 is a plan view of a microwave transmission line amplifier, with a portion of the top removed.
FIG. 5 is a longitudinal partially-sectional view taken along line 5—5 of FIG. 4.
FIG. 6 is a cross-sectional view taken along the line 6—6 in FIG. 5.
FIG. 8 is an explanatory diagram.

As shown in FIG. 5, the ends of the cylindrical metallic halves of capacitors 45 are retained in holes in the waveguide, and dielectric spacers separate the halves to provide the desired capacitances. As an alternative, a suitable load can be connected externally of the waveguide if desired by means of a waveguide to coaxial transition and a coaxial connector.

The low-pass transmission line is formed by strip or slab transmission line sections formed by conductor 51 and the upper and lower walls 41, 49 of the waveguide, connected between successive pairs of diodes 43. The transmission line sections are inductive and form series inductances which, together with the diode shunt capacitances, give a low-pass filter. The sections of conductor 51 are shown as U-shaped and are alternately located on opposite sides of insulating strip 47, forming a so-called "meander" line.

Coaxial connectors 50 and 52 have their center conductors connected to conductor 51, and form input and output connections for the signal frequency.

Signal propagation on the meander line is in the TEM mode, and is balanced. On the other hand, propagation of the pump and idler frequencies is in the waveguide $TE_{10}$ mode. Hence there is little if any interaction therebetween. Also, the cutoff frequency of the low-pass line is in general below that of the waveguide, hence providing additional isolation.

Figure 7:
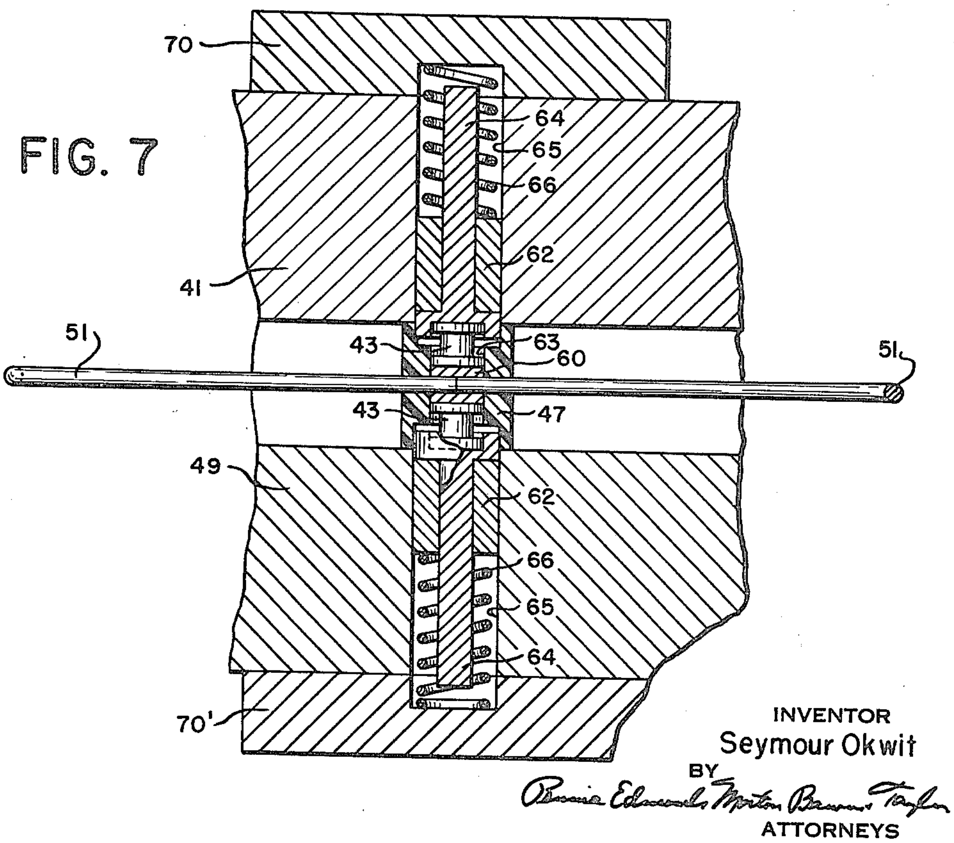
FIG. 7 is an enlarged fragmentary section taken along line 7—7 in FIG. 5.

FIG. 7 is a fragmentary sectional view illustrating a way of mounting a pair of diodes 43 in the structure. The diodes 43 are axially aligned in the insulating strip 47 with confronting terminals thereof in contact with a conductive terminal disc 60. Sections of conductor 51 extend into holes in the sides of disc 60. Flanged rods 64 are attached to the opposite terminals of the diodes and provide electrical contact with the waveguide through collars 62 fitting in holes 65 in the top and bottom walls 41, 49 of the waveguide. Springs 66 are placed between the collars 62 and the top and bottom plates 70, 70' to urge the components into tight electrical contact.

Referring to FIG. 8, the relative relationship between the electric fields for signal, pump and idler frequencies is shown. The signal propagates in a balanced TEM mode, as indicated by arrows $f_s$ extending in opposite directions from conductor 51. The pump frequency propagates in an unbalanced waveguide $TE_{10}$ mode, as indicated by arrows $f_p$ extending in the same direction between upper and lower walls. The diodes of a pair are poled in opposite directions as shown. Thus as the capacitance of the upper diode increases due to the applied pump power, the capacitance of the lower diode decreases, and vice versa. As a result, the idler frequency will be developed in the waveguide mode as indicated by the arrows $f_i$ extending in the same direction.

Since the diodes are oppositely poled, a single source of bias suffices, and can be applied to conductor 51 through one of connectors 50, 52. This greatly facilitates biasing.

As will be clear, the pump frequency is effective across each pair of diodes so as to vary the capacitance thereof. Since these diodes are effectively in parallel across the sections of the low pass line 51, the varying capacitance will be effective at the signal frequency to produce reactance amplification of energy at that frequency and produce a corresponding idler frequency.

The designs of the bandpass line and the low-pass line are correlated as described above to provide a substantially fixed idler frequency having a fixed phase-propagation constant as the pump frequency is varied to tune to different signal frequencies. The equivalent circuit corresponding to the bandpass line is well known. See for example "Reference Data for Radio Engineers," 4th edition, I.T. & T. 1956, pp. 174–175. The phase shift per section can be expressed as:

$$\beta=2\sin^{-1}\left\{\frac{1}{\left[1+\frac{\left(\frac{f_2}{f_1}\right)^2-\left(\frac{f}{f_1}\right)^2}{m_1^2\left[\left(\frac{f}{f_1}\right)^2-1\right]}\right]^{1/2}}\right\} \quad (5)$$

where $f_1$ and $f_2$ denote lower and upper cutoff frequencies respectively and $m_1$ is the filter constant of the line. $f$ is the variable value of frequency.

Similarly, the phase-shift per section of the low-pass signal frequency line can be expressed as $$\beta=2\sin^{-1}\left(\frac{f}{f_3}\right) \quad (6)$$

where $f_3$ is the cutoff frequency.

Starting with these equations and using the procedure outlined above, cutoff frequencies and a filter constant can be determined which will satisfy the required conditions and the component values can be computed.

For practical reasons, it is desirable to employ a minimum number of variable reactance elements along the transmission lines. When diodes are used, the minimum number required for a high gain condition can be determined from the following gain equation:

$$G=\frac{1}{\left(\frac{\Delta\beta}{\xi}\right)^2+\cos^2\frac{\xi L}{2}} \quad (7)$$

when $$\frac{\Delta\beta}{\xi}\ll 1$$

Here, L is the length of the transmission line;

$$\Delta\beta=|\beta_p-(\beta_s+\beta_i)|$$

which is the deviation from the optimum propagation-constant condition of Equation 2;

$$\xi=\frac{C_1}{C_6}\sqrt{\beta_s\beta_i}$$

and $C_1/C_0$ is a measure of the diode nonlinearity, $C_0$ is the average value of capacitance, or the first term in a Fourier series expressing the capacitance of the diode as varied by the pump power, and $C_1$ is the coefficient of the second term. Higher order terms are usually neglected. For a given variable reactance diode, this ratio can be increased by increasing the pump frequency power.

To achieve high gains, the denominator of the Equation 7 should be as small as possible consistent with stability. Hence $\Delta\beta$ should be small and $\xi$ L should approach $\pi$.

In the arrangement of FIG. 4, each section of the transmission line between pairs of diodes produces a given portion of the total phase shift so that the transmission line can be considered as being divided into a number of sections corresponding to the number of pairs of diodes, each section contributing a given portion to the total phase shift. With the number of equivalent sections denoted N:

$$N=\frac{\pi}{\left(\frac{C_1}{C_0}\right)\sqrt{\beta_s\beta_i}}\ \text{(approx.)} \quad (8)$$

The idler phase-propagation constant will be approximately constant, since the idler frequency is approximately constant. The signal phase-propagation constant $\beta_s$ will vary with the signal frequency, and is at a minimum at the low frequency end of the band. Consequently, this minimum value may be used in determining the minimum number of diodes for high gain. For a given value of the diode non-linearity characteristic, a given pump power, and a given value of phase-shift per section, the number N can be determined.

If the quantity $C_1/C_0$ remains constant as the receiver is tuned over its band, the gain will be greater at higher frequencies since $\beta_s$ will increase. To maintain a uniform gain over the band, the pump power can be decreased as the pump frequency is increased to tune to a higher signal frequency. Thus, the pump power supply may be designed so that the power varies simultaneously with variations in pump frequency.

Although the described embodiment employs discrete pairs of diodes to provide variable capacitance coupling between the lines, with suitable variable-reactance materials the distributed coupling could be effected in a continuous manner, as for example by the use of ferrite material. Also, instead of using a low-pass line for the signal, a band-pass line having a suitable characteristic in the signal band could be employed.

The invention has been described in connection with a specific embodiment. However, it will be understood by those skilled in the art that modifications may be made within the scope of the principles set forth, and that different types of transmission lines may be employed if desired.

I claim:

1. A backward-wave parametric amplifier which comprises (*a*) a signal-frequency transmission line having a forward-wave propagation characteristic, (*b*) a pump-frequency transmission line having a band-pass forward-wave propagation characteristic, (*c*) distributed non-linear variable-reactance means coupling the transmission lines, (*d*) and means for applying signal and pump frequencies to respective transmission lines at the adjacent ends thereof to produce signal and pump frequency waves propagating in the same direction in the lines and produce an idler frequency, (*e*) said pump frequency being high compared to the signal frequency to produce an idler frequency equal to the difference therebetween which is higher than the signal frequency, (f) said lines having frequency-phase characteristics yielding a phase propagation constant at said idler frequency substantially equal to the algebraic difference of the phase propagation constants at the pump and signal frequencies, said frequency-phase characteristics being predetermined to yield respective phase propagation constants which change in the same direction in respective signal and pump frequency bands with approximately a constant small difference therebetween to yield a small idler phase propagation constant at an approximately fixed center frequency of the idler frequency passband lying near the low-frequency cutoff region of the pump-frequency transmission line in which passband the idler frequency propagates in a direction opposite to the pump frequency.

2. A backward-wave parametric amplifier which comprises (a) a signal-frequency transmission line having a forward-wave propagation characteristic, (b) a pump-frequency transmission line having a bandpass forward-wave propagation characteristic, (c) distributed non-linear variable-reactance means coupling the transmission lines, (d) and means for applying signal and pump frequencies to respective transmission lines at the adjacent ends thereof to produce signal and pump frequency waves propagating in the same direction in the lines and produce an idler frequency, (e) said pump frequency being high compared to the signal frequency to produce an idler frequency equal to the difference therebetween which is higher than the signal frequency, (f) said lines having frequency-phase characteristics yielding a phase propagation constant at said idler frequency substantially equal to the algebraic difference of the phase propagation constants at the pump and signal frequencies, said frequency-phase characteristics being predetermined to yield approximately equal slopes in respective signal and pump frequency bands with the pump phase propagation constant less by a small amount than the signal phase propagation constant to yield a small idler phase propagation constant at an approximately fixed center frequency of the idler frequency passband lying near the low-frequency cutoff region of the pump-frequency transmission line in which passband the idler frequency propagates in a direction opposite to the pump frequency.

3. A backward-wave parametric amplifier which comprises (a) a signal-frequency transmission line having a forward-wave propagation characteristic and a high-frequency cutoff point, (b) a pump-frequency transmission line having a band-pass forward-wave propagation characteristic, (c) the high-frequency cutoff point of the signal frequency line being substantially below the band-pass region of the pump-frequency line, (d) distributed non-linear variable-reactance means coupling the transmission lines, (e) and means for applying signal and pump frequencies in respective bands to respective transmission lines at the adjacent ends thereof to produce signal and pump frequency waves propagating in the same direction in the lines and produce an idler frequency, (f) said pump frequency being high compared to the signal frequency to produce an idler frequency equal to the difference therebetween which is higher than the signal frequency and lies within the bandpass region of the pump transmission line, (g) said lines having frequency-phase characteristics predetermined to yield approximately equal slopes in respective signal and pump frequency bands with the pump phase propagation constant less by a small amount than the signal phase propagation constant to yield a small idler phase propagation constant at an approximately fixed center frequency of the idler frequency passband lying near the low-frequency cutoff region of the pump-frequency transmission line where the group velocity is relatively low and in which passband the idler frequency propagates in a direction opposite to the pump frequency.

4. Apparatus in accordance with claim 3 in which the signal-frequency transmission line is a low-pass line.

5. Apparatus in accordance with claim 2 in which (a) the pump-frequency band-pass transmission line comprises a waveguide periodically loaded with variable capacitance means, (b) and the signal-frequency transmission line comprises inductive transmission line sections in said waveguide connected between said variable capacitance means to provide a series inductance-shunt capacitance low-pass transmission line.

6. Apparatus in accordance with claim 3 in which (a) the pump-frequency bandpass transmission line comprises a waveguide periodically loaded with pairs of variable capacitance diodes connected in series opposition between top and bottom walls of the waveguide, (b) and the signal-frequency transmission line comprises conductor sections positioned between the top and bottom walls of the waveguide to form TEM mode transmission line sections, (c) said conductor sections being connected between the junctions of said pairs of diodes and being inductive to provide, with the diode capacitances, a series inductance-shunt capacitance low-pass transmission line.

References Cited by the Examiner

Breitzer et al.: "Microwave Journal," August 1959, pages 34–37.

Boyet et al.: "Proceedings of the IRE," July 1960, pages 1331–1333.

Fisher: "Proceedings of the IRE," July 1960, pages 1227–1232.

Currie et al.: "Proceedings of the IRE," December 1960, pages 1960–1987.

Reed: "Semiconductor Products," February 1961, pages 35–42.

Lee: "IRE Transactions on Microwave Theory and Techniques," November 1961, pages 578–579.

Okwit et al.: "IRE Transactions on Electron Devices," November 1961, pages 540–549.

ROY LAKE, *Primary Examiner.*

JOHN KOMINSKI, *Examiner.*